Feb. 9, 1965 H. T. CLOSSON 3,169,227

DIODE-CAVITY PARAMETRIC AMPLIFIER

Filed March 10, 1961

INVENTOR
HENRY T. CLOSSON

BY Wm. J. Nolan
ATTORNEY

United States Patent Office 3,169,227
Patented Feb. 9, 1965

3,169,227
DIODE-CAVITY PARAMETRIC AMPLIFIER
Henry T. Closson, Union, N.J., assignor to S-F-D Laboratories, Inc., Union, N.J., a corporation of New Jersey
Filed Mar. 10, 1961, Ser. No. 94,929
2 Claims. (Cl. 330—4.9)

This invention relates to the art of amplifying electromagnetic waves, more particular, to amplifiers of the parametric type having a low noise level.

Typical high-gain amplifiers employ electron tubes which inherently emit a cloud of electrons having a large thermal energy spread causing noise in the system which is further amplified. Noise problems are obviously not present in communication systems where the power received by the antenna is large in comparison to the noise power produced in the first amplifying stage of the amplifier. Also, noise problems are not present in systems which are operating in the lower radio frequency range, because in these systems the external noises such as produced by atmospheric conditions are a limiting factor which determines if a low frequency, low power-level signal can be amplified without noises. But as higher and higher frequencies are incorporated in communication systems, the external noises being mainly in the low frequency spectrum have little effect on the information content of the high frequency transmitted waves. When an antenna receives low-power high-frequency waves, a low noise amplifier is required in the first amplifying stage so that the signal may be satisfactorily amplified.

One particular type of a low noise amplifier is a parametric amplifier which employs a cavity resonator and a capacitor in the resonator which varies cyclically as the electrostatic field across it cyclically varies. A capacitor of this type is commonly called a varactor which usually is made with a dielectric material whose dielectric constant varies with the electrostatic field applied across it. The resonator is coupled to a high frequency oscillator called a pump which causes the varactor capacitance to vary as a function of the pump frequency. The signal to be amplified is also coupled into the resonator also causing the varactor capacitance to vary as a function of the signal frequency. In order to obtain the highest gain possible from the amplifier, the idler frequency which is the frequency extracted from the resonator is made equal to the value of the pump frequency minus the signal frequency. If the pump frequency is much larger than the signal frequency the gain would be larger. The idler frequency being at a much higher power level than the signal frequency can now be amplified by a conventional amplifier. This type of parametric amplifier is called a negative resistance up-converter and up to now has been limited in gain and bandwidth, especially if it is operating between 500 and 1,000 megacycles.

The principal object of this invention is to provide an improved low noise high frequency parametric amplifier having a larger gain and a broader bandwidth.

A feature of this invention is the use of a band-pass filter in the pump frequency circuit and also in the idler frequency circuit together with a low-pass filter in the signal circuit to resonate at the signal, idler and pump frequencies simultaneously without mutual interferences between the frequencies.

Another feature of this invention is the utilization of two up-converters to provide an intermediate frequency for the next amplifying stage which intermediate frequency does not drift with the pump frequency drift.

Still another feature of this invention is the utilization of a broadband circuit in the signal channel to broaden the operating bandwidth.

Still another feature of this invention is the utilization of a self-biasing varactor for providing improved gain stability as a function of variations in pump power.

Still another feature of this invention is the utilization of an impedance transformer in the signal channel making the impedance of the signal channel approximately equal to the negative resistance developed at the varactor terminal thereby increasing the gain-bandwidth product of the amplifier.

These and other features and advantages of the present invention will become apparent upon a perusal of the following specification taken in connection with the accompanying drawings, wherein.

Figures 1, 2, 3, 4:
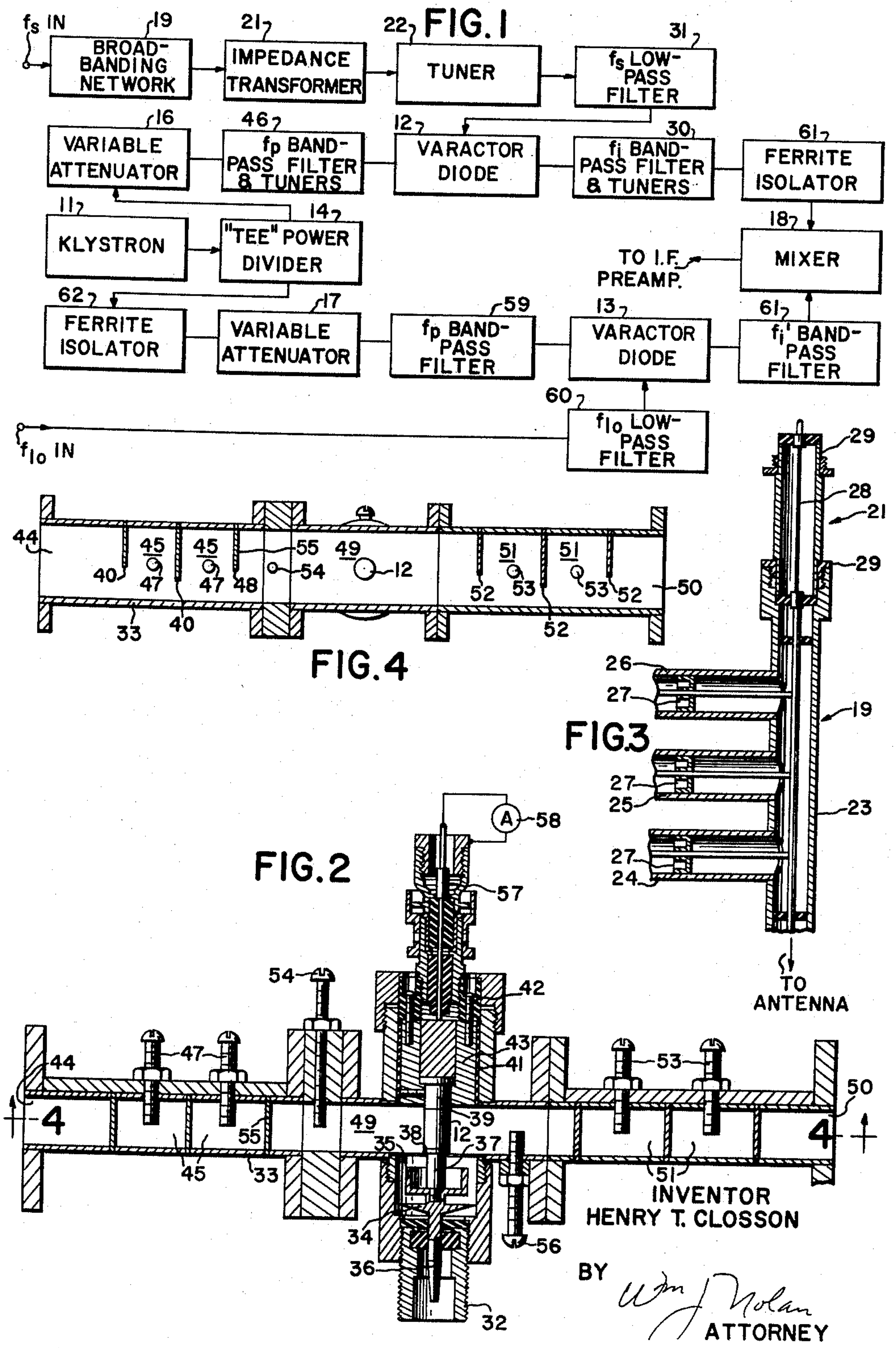
FIG. 1 is a block diagram of the parametric amplifier circuit.
FIG. 2 is a cross-sectional view of the up-converter including the low-pass filter, pump frequency band-pass filter, varactor diode, and idler-frequency band-pass filter.
FIG. 3 is a cross-sectional view of a typical broadbanding network and impedance transformer for the signal frequency.
FIG. 4 is a sectional view of the up-converter taken along line 4—4 of FIG. 2.

Amplifiers often employ the heterodyne action wherein the input signal carrier frequency is mixed with another frequency obtained from a local oscillator so that a fixed intermediate frequency (IF) may be obtained and amplified in a fixed frequency amplifier. Of course, the local oscillator and carrier signal frequency are gang-tuned so that the difference between the frequencies is always constant to produce a fixed intermediate frequency. Therefore, this invention preferably will be explained as used in a heterodyne amplifier but the principles and features of this invention can also be used in any type of amplifying system.

Referring to FIG. 1, the block diagram shows a circuit for producing a fixed IF while employing the parametric amplifying principle to produce low noise amplification with a large gain and large bandwidth. A single X-band klystron 11 supplies the pump power at a pump frequency ($f_p$) of over 11 kilomegacycles which is channeled to two varactor diodes 12 and 13 through a power divider "Tee" 14 so that the IF produced by the amplifier is fixed and not dependent on any drift in the pump frequency. Since the gain of a parametric amplifier is a function of the pump power level incident on the varactor, attenuators 16 and 17 are placed on both sides of the power divider 14 so that the pump power supplied to each varactor diode is controlled thereby providing a means for independently adjusting the gain of the signal and local oscillator channels. Both idler frequencies ($f_i$ and $f_i'$) are mixed by a mixer 18, such as a hybrid mixer sold under the trademark "Orthomode" by Varian Associates, to produce the fixed intermediate frequency (IF).

The signal is received from a suitable source such as an antenna (not shown) and passes through a broadbanding network 19, impedance transformer 21 to a tuner 22 which is tuned to the desired signal frequency ($f_s$). The broadbanding network 19 and the impedance transformer as used in this embodiment are shown in detail in FIG. 3 wherein the signal from the antenna is conducted through a coaxial line 23 which has three stub tuners 24, 25 and 26. The tuners form coaxial line T-branches extending from the coaxial line 23 with an adjustable short 27 between the T-branches center conductor and outer conductor. The two outside tuners 24 and 26 are adjusted to present equal susceptance in shunt with the main transmission line 23 and the distance between them is about .4 wavelength at $f_s$. The exact electrical spacing is effectively adjusted with the center tuner 25. Thus, the use of three stub tuners allows one to adjust to maximum operating bandwidth. A parametric amplifier which employs the broadband network 19 has its bandwidth increased by at least a factor of two over that inherent to the basic amplifier circuit of the prior art which does not employ any broadbanding. The impedance transformer 21 is used to increase the gain-bandwidth product of the amplifier and is a coaxial line one-quarter wavelength long having a center conductor 28 of much smaller diameter than the center conductor of line 23 so that the impedance of the signal input circuit is raised to approach the magnitude of the negative resistance developed at the varactor terminals. In this embodiment the center conductor 28 of small diameter is copper wire .04 inch in diameter and one-quarter wavelength long and raises the impedance of the input circuit from 50 ohms to 400 ohms. The ends 29 of the transformer 21 are made of standard coaxial line connectors so that the transformer can be readily installed in the system.

The signal from the tuner 22 next passes through a low-pass filter 31 (this could be a band-pass filter which operates at the signal frequency) to the varactor diode 12 more clearly shown in FIG. 2 wherein the $f_s$ signal from the tuner 22 is fed to a coaxial-line male fitting 32 perpendicularly disposed on a waveguide section 33. The low-pass filter comprises a radial line choke 34 and a cup-shape member choke 35 on the center conductor 36 of the fitting 32, the chokes being so spaced as to prevent the higher frequencies such as $f_p$ and $f_i$ from passing back to the tuner 22. The varactor diode 12 is disposed across the short dimension of the waveguide 33 and parallel to the electric fields of the waveguide's dominant mode. A terminal 37 of the diode 12 protrudes through an aperture 38 in the wall of the waveguide in non-contacting relation and connects to the center conductor 36 while the other terminal 39 is insulated from the waveguide by a thin tubular insulator 41 and a ring insulator 42. The insulator 41, being thin, passes alternating current but not direct current. The terminal 39 is held in place by a metal ring 43 within insulator 41.

After the high frequency pump power from the klystron 11 is attenuated by the attenuator 16 it enters the waveguide 33 through its left port 44 and through a pump-frequency filter 46 which is preferably a band-pass filter and is in the form of two waveguide cavities 45 which are preferably iris coupled to the pump and together by openings 40 and tuned by screws 47. A broad band-pass is not required in this circuit, therefore adjustment of the impedance match between diode 12 losses and pump circuit is obtained by a slight detuning of the pump filter with the two tuning screws 47. The pump power then passes through a suitable iris coupling arrangement 48 to an up-converter cavity 49 where the signal frequency mixes with the pump frequency and an up-converted idler frequency ($f_i$) is produced. The idler frequency is extracted from the right port 50 after it passes through idler frequency band-pass filter 30 which, like filter 46, comprises two cavities 51 coupled by openings 52 to cavity 49 and to each other and tuned by screws 53 to produce, in the idler circuit, a "flat" frequency response over a range of several hundred megacycles in the cavities. A screw 54 protruding into cavity 49 and disposed at one-quarter wavelength from a short-circuit plane 55 affords a means of adjusting the idler resonant frequency when the circuit is initially aligned. A screw 56 also protruding into the cavity 49 at a point approximately .4 wavelength from the diode 12 at $f_i$ is used to introduce a variable standing waveratio to produce an over-all bandwidth of about 100 megacycles in the idler circuit. Filter 46 is narrow band since it is only required to pass the pump frequency; filter 30 is broad band but it does not pass the pump or signal frequencies; and the low-pass filter placed in the input line passes only the lower frequency signal. Thus, power losses are reduced to a minimum thereby realizing maximum gain at the idler frequency, and yielding a high efficiency system.

By the use of band-pass filters 46 and 30 and the low-pass filter 31, the signal, pump and idler frequencies are simultaneously resonant without mutual interference. This enables independent adjustment of impedance matching at the three frequencies.

The output pump power of the klystron inherently fluctuates and a self-biased varactor diode 12 provides some stability in the output gain of the amplifier. In this embodiment the terminal 39 of the varactor diode 12 operates at a floating potential of approximately .75 volt with respect to the waveguide. This is accomplished by placing a .5 megohm resistor 57 in series with the varactor terminal 39 which resistor draws enough current from the teminal through a current meter 58 to produce the above potential, and the current meter may be used to monitor the magnitude of the rectified current.

As mentioned above, the amplifier shown is employed in a heterodyne system and thus the IF from the mixer 18 must be stable. As in all applications which employ the heterodyne principle a local oscillator (not shown) is employed therein. The frequency ($f_{lo}$) from the local oscillator is also up-converted in the varactor diode 13 which has an $f_p$ band-pass filter 59, a low-pass filter 60 and an idler-frequency ($f_i'$, which in this circuit is $f_p - f_{lo}$) band-pass filter 61, which filters accomplish similar functions as $f_p$ band-pass filter 46, $f_s$ low-pass filter 31 and $f_i$ band-pass filter 30, respectively. Since the local oscillator up-converter system operates at unity gain and does not require broadbanding, the tuners 47, 53, 54 and 56 shown in FIG. 3 may be removed from the up-converter 13. The frequencies $f_i$ and $f_i'$ are then combined together in the mixer 18 to produce the IF.

Since the gain of the amplifier is sensitive to changes in the load impedance presented to the idler frequency $f_i$, in this embodiment a ferrite isolator 61 is placed between filter 30 and mixer 18 to present a constant load impedance to $f_i$, regardless of changes in the impedance of mixer 18. A corresponding filter is not needed in the local oscillator circuit since this circuit has a gain of unity and is therefore not as sensitive to load impedance variations. A ferrite isolator 62 is placed between attenuator 17 and power divider 14 in order to maintain a constant power division ratio at divider 14 when variable attenuator 17 is adjusted.

Using the above teaching, an amplifier was made which operates at a center signal frequency of 875 megacycles, produces an over-all noise figure, which includes the mixer 18 and the IF amplifier, of no more than 2 decibels, has a bandwidth of 40 megacycles at a minimum gain of 17 decibels and has a maximum gain of at least 20 decibels at the center of the bandwidth.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. An amplifier comprising: a cavity resonator, a varactor having two end terminals and disposed in said cavity resonator substantially parallel to the electric field of the dominant mode of said cavity resonator, means for mounting one of said terminals of said varactor from said cavity resonator, the other of said terminals protruding through an aperture in the wall of said cavity resonator to form a center conductor of a coaxial line for feeding signal wave energy to be amplified into said varactor, means for coupling high frequency pump energy into said cavity resonator and said varactor to produce an idler frequency component and to amplify the signal wave energy, means for forming a low pass filter in said coaxial line for trapping pump and idler power in said cavity resonator, broad pass band filter means coupled to said cavity resonator to define a broadband resonant idler circuit, means forming a broadbanding network coupled to said coaxial line for broadbanding said input coaxial line circuit, a D.C. circuit interconnecting the two end terminals of said varactor and including a high resistive element in series with said D.C. circuit for self-biasing of said varactor for D.C. voltage whereby said amplifier is rendered less responsive to random fluctuations in the amplitude of the pump energy.

2. The apparatus according to claim 1 including the provision of an impedance transformer in said coaxial line for matching the relatively high impedance of said varactor to the relatively low impedance of said coaxial line.

References Cited in the file of this patent

UNITED STATES PATENTS

| | | |
|---|---|---|
| 2,970,275 | Kurzrok | Jan. 31, 1961 |
| 3,040,267 | Seidel | June 19, 1962 |
| 3,048,783 | Warren et al. | Aug. 7, 1962 |

OTHER REFERENCES

Pettai et al,: "Proceedings of the IRE," July 1960, pages 1323–1324.

Reed: "Semiconductor Products," February 1961, pages 35–42.

Reed: "IRE Transactions on Electron Devices," April 1959, pages 216–224.